United States Patent
Harjung

(10) Patent No.: US 7,379,856 B2
(45) Date of Patent: May 27, 2008

(54) MODELING AN ELECTRONIC DEVICE

(75) Inventor: Rolf Harjung, Holzgerlingen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 600 days.

(21) Appl. No.: 10/635,198

(22) Filed: Aug. 6, 2003

(65) Prior Publication Data
US 2004/0138866 A1 Jul. 15, 2004

(30) Foreign Application Priority Data
Jan. 15, 2003 (EP) .................................. 03000829

(51) Int. Cl.
*G06F 17/50* (2006.01)
(52) U.S. Cl. ........................................... 703/14; 716/5
(58) Field of Classification Search .................. 703/14, 703/2; 438/17; 716/5, 4, 15; 324/605, 609, 324/624, 707, 76.15, 76.16, 76.17, 76.21, 324/76.28; 329/323, 327, 351; 370/212; 375/238, 320, 350
See application file for complete search history.

(56) References Cited

U.S. PATENT DOCUMENTS

| | | | | | |
|---|---|---|---|---|---|
| 3,393,363 | A | * | 7/1968 | Forster, Jr. ................... | 398/191 |
| 3,431,490 | A | * | 3/1969 | Kwap .......................... | 324/617 |
| 4,438,404 | A | * | 3/1984 | Philipp ........................ | 327/263 |
| 5,162,723 | A | * | 11/1992 | Marzalek et al. ........ | 324/76.19 |
| 5,343,405 | A | * | 8/1994 | Kucera et al. ................ | 702/73 |
| 5,349,539 | A | * | 9/1994 | Moriyasu ..................... | 703/15 |
| 5,793,801 | A | * | 8/1998 | Fertner ........................ | 375/219 |
| 5,799,172 | A | * | 8/1998 | Gullapalli et al. ............ | 703/14 |
| 5,886,586 | A | * | 3/1999 | Lai et al. ..................... | 332/109 |
| 6,458,611 | B1 | * | 10/2002 | Gardner ........................ | 438/17 |
| 6,490,546 | B1 | * | 12/2002 | Kimmel et al. ............... | 703/14 |
| 6,653,848 | B2 | * | 11/2003 | Adamian et al. ........... | 324/638 |
| 6,772,400 | B2 | * | 8/2004 | Tsai .............................. | 716/4 |
| 6,779,157 | B2 | * | 8/2004 | Kondo ......................... | 716/2 |
| 6,836,574 | B2 | * | 12/2004 | Shioda et al. .................. | 385/2 |
| 6,856,148 | B2 | * | 2/2005 | Bodenstab ................... | 324/713 |
| 6,970,814 | B1 | * | 11/2005 | Ashley et al. ................ | 703/14 |
| 2003/0071606 | A1 | * | 4/2003 | Sunter ..................... | 324/76.15 |

(Continued)

FOREIGN PATENT DOCUMENTS

EP  1 128 293  8/2001

OTHER PUBLICATIONS

Guingale, A., European Search Report Application No. EP 03 00 0829 dated May 8, 2003.

(Continued)

*Primary Examiner*—Paul Rodriguez
*Assistant Examiner*—Carlos Ortiz-Rodriguez
(74) *Attorney, Agent, or Firm*—Ohlandt, Greeley, Ruggiero & Perle, L.L.P.

(57) ABSTRACT

For modeling a first device, a measured electrical behavior in at least one of time and frequency domain is received, wherein the measured electrical behavior at least substantially represents at least a portion of the electrical behavior of the first device. The first device is modeled by using a circuit with one or more circuit device, wherein each circuit device has a known model for its electrical behavior, and the circuit substantially represents the measured electrical behavior of the first device. The modeling comprises a step of approximating the measured signal response by sections of a curve.

11 Claims, 5 Drawing Sheets

U.S. PATENT DOCUMENTS

2004/0096021 A1* 5/2004 Koval .................. 375/350

OTHER PUBLICATIONS

Cory S.D. et al. Automatic Netlist Extraction for Measurement-Based Characterization of Off-Chip Interconnect, IEEE, Oct. 1997, vol. 45,No. 10, pp. 1934-1940.

Novellino, J., System Measures and Models Interconnects, Cleveland, Ohio, vo. 41,No. 6, Mar. 18, 1993, p. 122, 124 and 126.

Hatden L.A. et al., Measurement and Characterization of High-Speed Interconnections Using Time Domain Network Analysis, San Francisco, Ca, Oct. 1992, pp. 144-149.

Arunachalam, Ravishankar et al. "CMOS Gate Delay Models for General RLC Loading". Proceedings of the 1997 International conference on Computer Design (ICCD '97), 0-8186-8206-X/97, 1997 IEEE, pp. 1-7.

Dartu, Florentin et al. "A Gate-Delay Model for High-Speed CMOS Ciruits". 31$^{st}$ ACM/IEEE Design Automation Conference, pp. 576-580, 1994.

* cited by examiner

| i | 0 | 1 | 2 | 3 | 4 | 5 | 6 | 7 | 8 |
|---|---|---|---|---|---|---|---|---|---|
| $t_i$ / ps | 0 | 150 | 250 | 300 | 400 | 500 | 650 | 900 | 1400 |
| $V_i$ / V | 0 | 0.05 | 0.25 | 0.45 | 0.7 | 0.8 | 0.85 | 0.9 | 0.95 |

MODELING AN ELECTRONIC DEVICE

BACKGROUND OF THE INVENTION

Modeling of electronic devices e.g. for simulation of electronic circuits comprising such devices, as known for example from the SPICE circuit simulation system, requires to know or reveal details about the internal construction of the device to be modeled. Often manufacturers of devices (like operational amplifiers) provide model parameter to be used in the SPICE system.

SUMMARY OF THE INVENTION

It is an object of the invention to provide an improved modeling of electronic devices. The object is solved by the independent claims. Preferred embodiments are given by the dependent claims.

According to the present invention it is not necessary to provide an analytical model describing the internal construction, but the measured (external) behavior of the device in time or frequency domain is used. In a preferred embodiment, the measured electrical behavior comprises a measured signal response on a predetermined electrical signal input to the device, and preferably comprises a measured signal response on a step signal.

The device can contain any kind of element like—for example—cables, board traces, connectors, packages, sockets, stubs, resistors, inductors or capacitors. Even multiple reflections or frequency dependent parameters like skin effect or dielectric losses can be characterized according to preferred embodiments.

In testing of modern high-speed electronic devices, e.g. in the frequency range of tenth to ten times GHz, the corresponding high-speed signal path e.g. between an Automated Test Equipment (ATE) and a Device Under Test (DUT) becomes relevant influence on the measured signals. In a preferred embodiment the device to be modeled is such high-speed signal path, which might be connected between the ATE and the DUT. The device to be modeled can also be a line drive output of such ATE, an n-port network, etc.

According to an embodiment, the device to be modeled can be characterized in the time domain by at least one of its pulse or step response. An ideal pulse allows characterizing the device to be modeled in the time domain. Such ideal pulse is infinitely short, infinitely high, has a predetermined energy, and is known as Dirac pulse. Such Dirac pulse, however, is often not sufficiently feasible in reality. Therefore, in a preferred embodiment a substantially ideal pulse or the response to a step input signal is used to build the model out of measurement data.

It is also possible to use the measured external behavior of the device in the frequency domain, e.g. using a vector-network-analyzer. For example, the step response can be calculated by an inverse Fourier transformation and subsequent integration of the resulting pulse response.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference signs.

MORE DETAILED DESCRIPTION OF PREFERRED EMBODIMENTS ACCORDING TO THE INVENTION

Without limitation of the general inventive concept, in the following the invention is described on the example of a 2-port network with ports x and y. As known from systems theory such a 2-port network can be fully described by the so-called S-parameters in the frequency domain. In an analog manner, the network can also be described in the time domain by its step response according to the following convolution equations:

$$e_{R1}(t) = sr_{11}(t) * e_{I1}'(t) + sr_{12}(t) * e_{I2}'(t) \quad (1)$$

$$e_{R2}(t) = sr_{21}(t) * e_{I1}'(t) + sr_{22}(t) * e_{I2}'(t) \quad (2)$$

The term $sr_{xy}(t)$ stands for the response at port x on a stimulation at port y with an ideal step signal. The term $e_{Iy}'(t)$ stands for the first derivative of the incident wave into port x. The symbol "*" stands for the convolution.

To put the above equations (1) and (2) into a simple recipe: Take each little step the incident signal makes, multiply with the step response and delay the result by the time when your input step takes place. Summing everything together then generates the response to the input signal. The responses to each individual input signal can be added together according to the principal of superposition.

Figure 1:
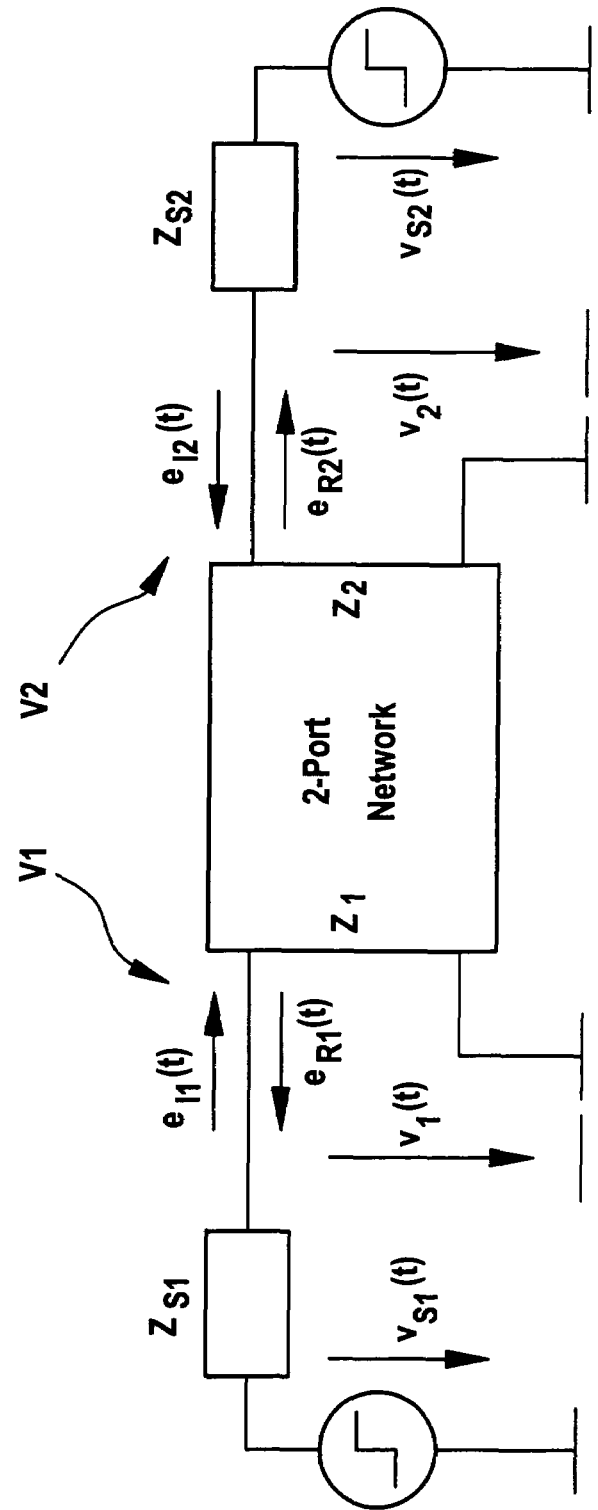
FIG. 1 shows stimulating incident waves into a 2-port network.

FIG. 1 shows stimulating incident waves into a 2-port network. The relationship between voltages and currents at the ports v1 a nd v2 of the network are defined by their characteristic impedances Z1 and Z2. Incident waves can be generated by external voltage sources:

$$e_{I1S}(t) = Z_1/(Z_{S1}+Z_1) \times v_{S1}(t) \quad (3)$$

$$e_{I2S}(t) = Z_2/(Z_{S2}+Z_2) \times v_{S2}(t) \quad (4)$$

or by reflections at the ports $$e_{I1R}(t) = (Z_{S1}-Z_1)/(Z_{S1}+Z_1) \times e_{R1}(t) \quad (5)$$

$$e_{I2R}(t) = (Z_{S2}-Z_2)/(Z_{S2}+Z_2) \times e_{R2}(t) \quad (6)$$

According to the principle of superposition, it results from addition:

$$e_{I1}(t) = e_{I1S}(t) + e_{I1R}(t) \quad (7)$$

$$e_{I2}(t) = e_{I2S}(t) + e_{I2R}(t) \quad (8)$$

Thus, from systems theory it is clear how incident waves are generated by transmission line theory and how reflected waves are generated by convolution with step responses. This information can be used to construct a comprehensive model to be used in the SPICE system. Usually a 50-Ohm environment is given and therefore in the following the model is designed with 50-Ohm characteristic impedance at its ports. Any deviation from that value is regarded as internal effect and will show up in the step response part of the model.

Figure 2:
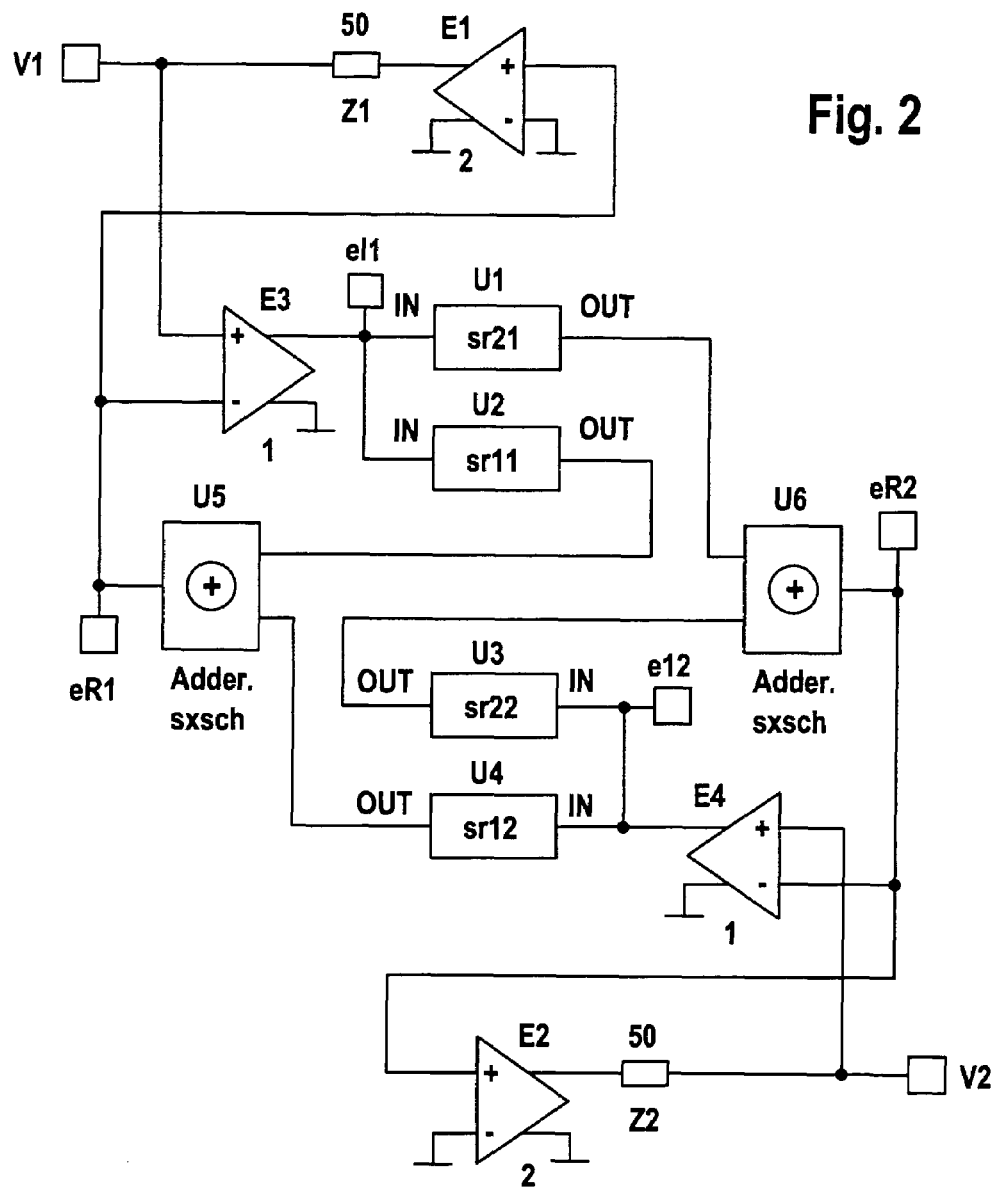
FIG. 2 shows the SPICE model of the 2-port network of FIG. 1.
Figure 3:
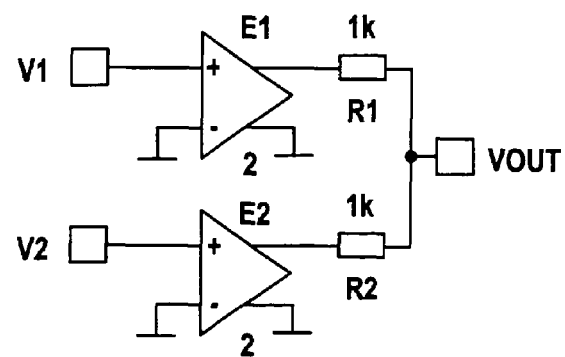
FIG. 3 shows the model of a voltage adder.

FIG. 2 shows the SPICE model of the 2-port network of FIG. 1 and FIG. 3 shows the model of a voltage adder.

Calculating the incident waves from the schematic result into:

$$e_{I1}(t)=(Z_1 \times v_{S1}(t)+(Z_{S1}-Z_1) \times e_{R1}(t))/(Z_{S1}+Z_1) \quad (9)$$

$$e_{I2}(t)=(Z_2 \times v_{S2}(t)+(Z_{S2}-Z_2) \times e_{R2}(t))/(Z_{S2}+Z_2) \quad (10)$$

$$e_{R1}(t)=sr_{11}(t)*e_{I1}'(t)+sr_{12}(t)*e_{I2}'(t) \quad (11)$$

$$e_{R2}(t)=sr_{21}(t)*e_{I1}'(t)+sr_{22}(t)*e_{I2}'(t) \quad (12)$$

Using simple mathematics, it can be shown that these equations match with the calculated equations mentioned above.

Figure 4:
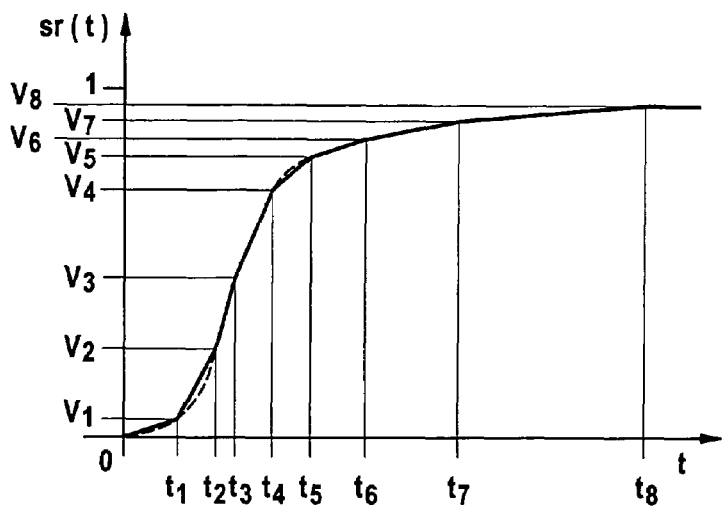
FIG. 4 shows an example for an approximated step response.
Figure 5:
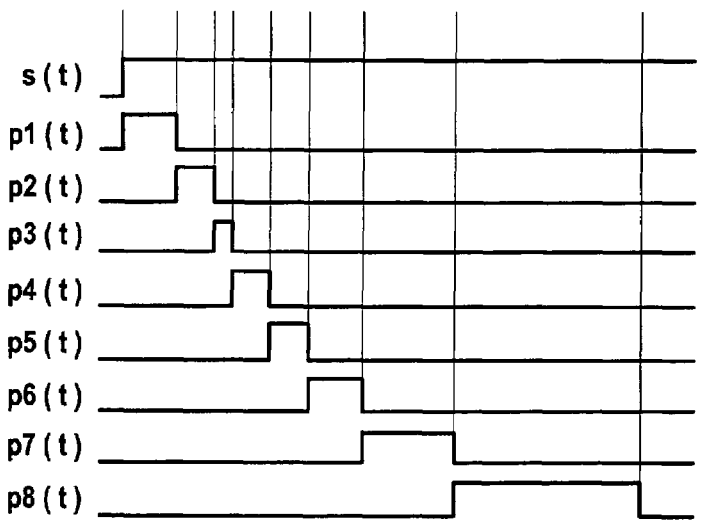
FIG. 5 shows time and voltage values of the sampling points shown in FIG. 4.

Any arbitrary step response can be approximated with arbitrary accuracy by a section-wise linear curve like in the example shown in the top graph of FIG. 4. The corresponding sampling points for the approximation in this example have the time and voltage values listed in FIG. 5. In order to construct the step response, the incoming step s(t) is stripped down to the pulses $p_i(t)$ having their transitions at the sampling points used for approximation. Those pulses are used to control current sources with a trans-conductance representing the slope in the corresponding section of the step response like depicted in FIG. 6.

The delays $TD_i$ of the transmission lines $T_i$(i=1, 2, . . . , 8) represent the lengths of the construction pulses $p_i(t)$:

$$TD_i = t_i - t_{i-1} \quad (13)$$

The differential input signals on the voltage controlled current sources $G_i$ look like the construction pulses $p_i$ in FIG. 4. The trans-conductances $GT_i$ have to be:

$$GT_i = (V_i - V_{i-1}) \times C1/(t_i - t_{i-1}) \quad (14)$$

The resistors R1 and R2 define the DC path for the output voltage. They can be calculated from the end value of the step response:

$$R2/(R1+R2) = sr(\infty)/s(\infty) = sr(\infty)/1V \quad (15)$$

The time constant of the RC element $$\tau_{RC} = C1 \times (R1 \| R2) \quad (16)$$

has to be large enough so that the exponential loading curve does not interfere with the shape of the step response. A good value would be if the time constant were 1000 times larger that the time range between the first and the last sampling point. This limits the resulting voltage error of the simulated step response to below 0.1%.

Figure 6:
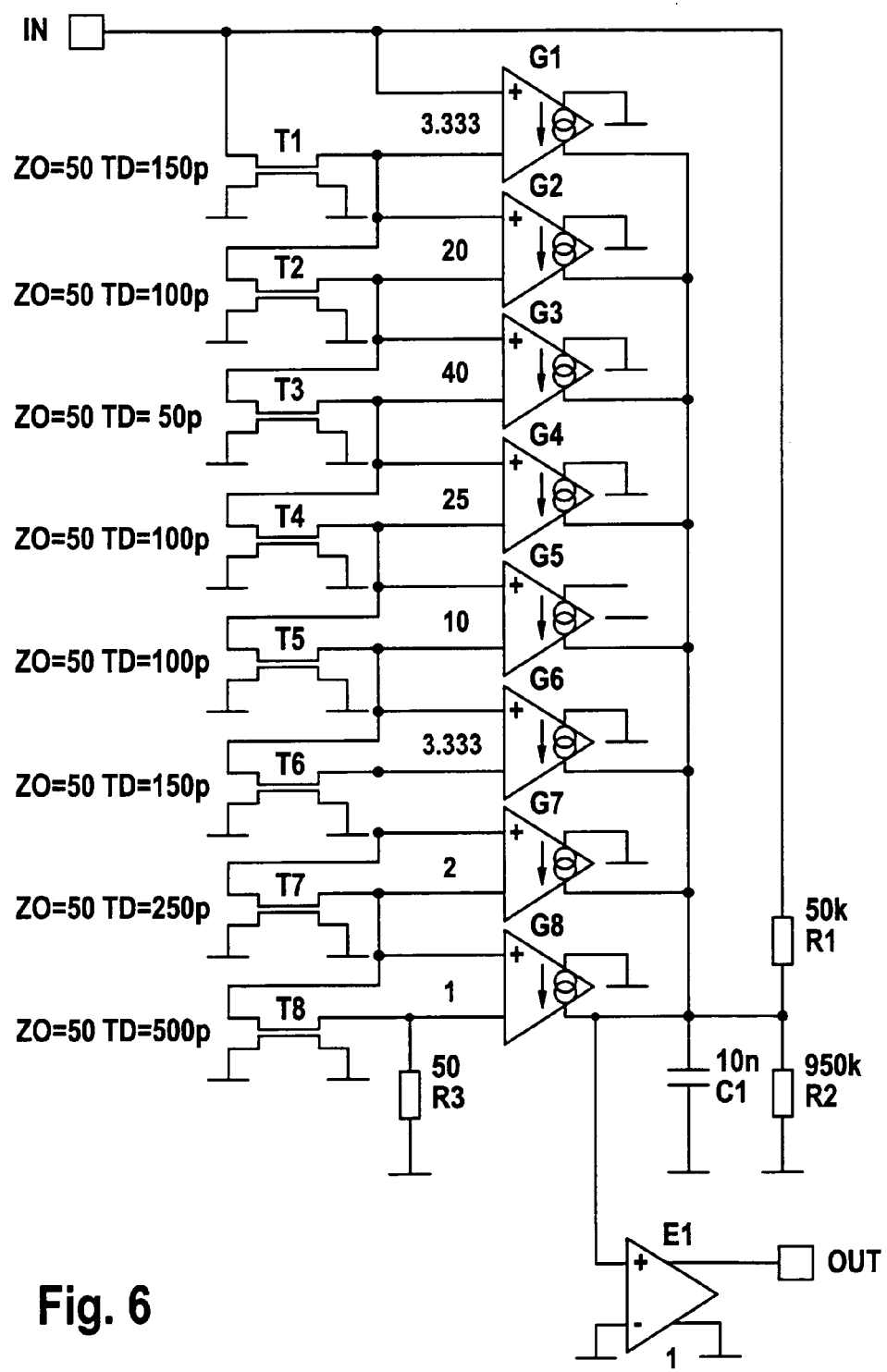
FIG. 6 shows a SPICE model representing a step response.

With the SPICE model shown in FIG. 6 a circuit is created that has the step response needed for the device to be modeled. As the model is linear and time invariant, its response to any arbitrary input signal is equal to the response of the signal path to be characterized in the described embodiment.

Figure 7:
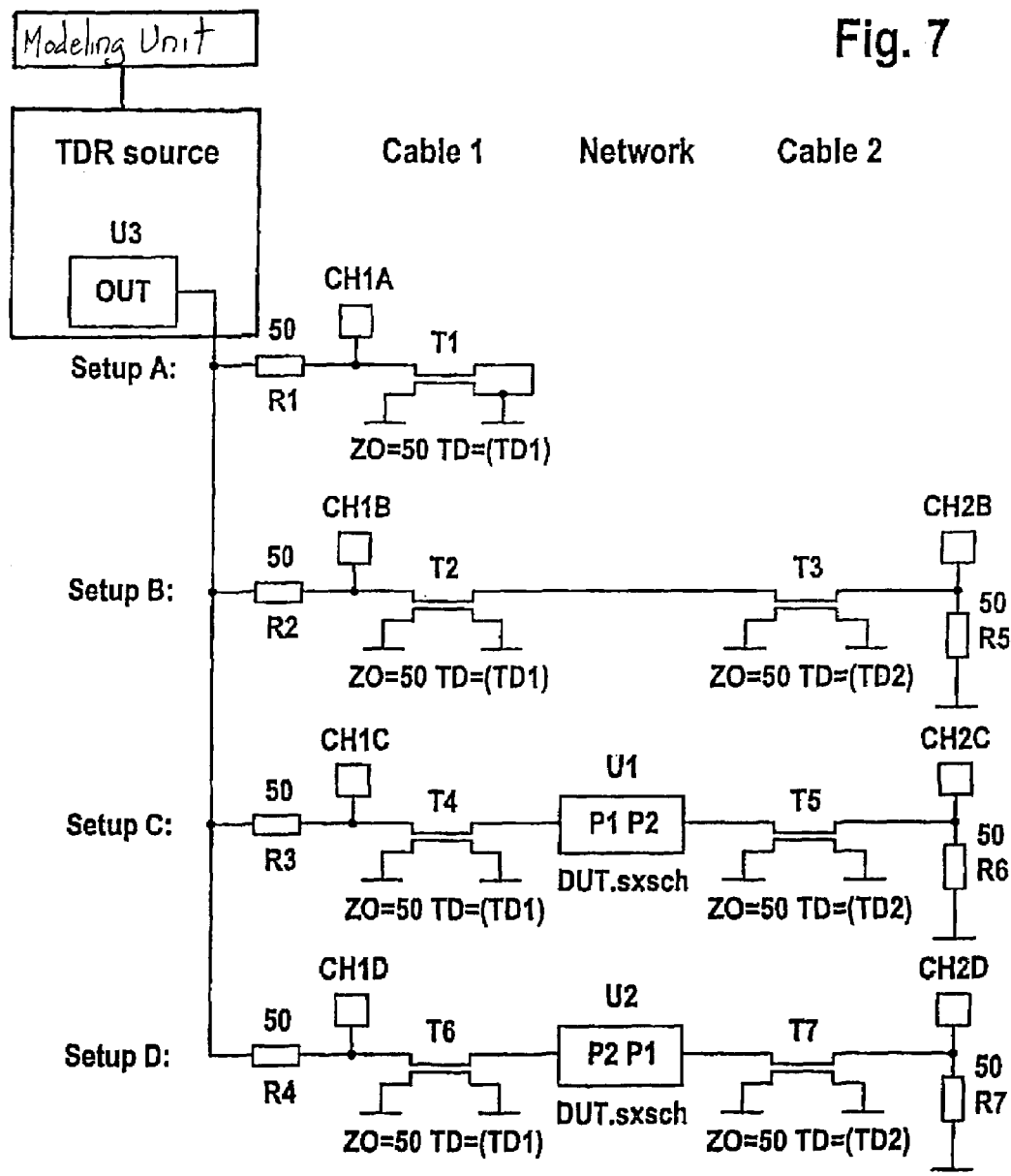
FIG. 7 shows how the four step responses of a 2-port network can be measured using a time domain reflection (TDR) oscilloscope.

FIG. 7 shows how the four step responses of a 2-port network can be measured using a time domain reflection (TDR) oscilloscope. The internal TDR source is dedicated to the first channel CH1. It generates a steep edge with a rise time in the order of 40 ps. This can be taken as an approximate ideal step scaled with a factor. The delay time relative to the internally generated oscilloscope trigger can be observed as the point in time on the scope graph of channel 1 where the edge starts.

Setup A places a short circuit at the end of cable 1 generating a reflection coefficient of −1. Channel 1 of the oscilloscope sees a pulse with a length that equals the round trip delay of cable 1. The delay of single trip of cable 1 can be easily determined by placing markers at the 50% points of the pulse edges and taking half of the time distance between the two markers.

In Setup B the two channels capture the same signal but on channel 2 (CH2) the combined delay of cable 1 and cable 2 takes effect. The delay of cable 2 can be determined by placing markers at the 50% points of the two channels, reading out the time distance and subtracting the delay time of cable 1.

The Setups A and B can be regarded as a calibration procedure.

In Setup C and Setup D the reflections at the stimulated port can be observed as superposition to the stimulating time domain reflection pulse on channel 1 of the oscilloscope with an additional roundtrip cable 1 delay. The transmitted signals can be observed on channel 2 with an additional delay of cable 2.

The four step responses can now be derived very easily from the measurement and from using equations representing the Setup A to Setup D described above.

Although the edge of a TDR edge is usually very fast, it certainly is not a perfect step. In order to eliminate the remaining distortions due to finite slew rate, possibly over— and undershoot and settling phase to final value, the ideal step response can be calculated from the measured stimulus and response by the method described below.

At first, the captured waveforms together with a shape of an ideal step starting at the same time as the stimulus have to be converted into a periodic shape by extending the measured date set with the same edge that has been mirrored at the average value of the first and the last sampling point.

The resulting signals can then be converted into the frequency domain via Fast Fourier Transformation (FFT). The transfer function results from the division from the output signal by the input signal. Multiplication of transfer function and the ideal step in the frequency domain gives the spectrum of the ideal step response that can be converted back into time domain via inverse FFT.

As the output voltage of the model shown in FIG. 2 is generated by integrating loading currents, the voltage error in the transient analysis strongly depends on the integration method and the time steps of the SPICE simulator. As a rule of thumb, the time step should be in the same order of magnitude as the delay time of the transmission lines in the step response model. Depending of which simulator is used, there may be a lot more options controlling simulation accuracy. The best way to test those parameters is to stimulate the model with a single edge and verify if the final value is close enough to the theoretical end voltage.

Differing from the comprehensive model shown in FIG. 2 there are applications where not all step responses are of interest and for such applications the model can be drastically simplified. In many cases only the transmission of a signal from port 1 to port 2 is necessary. This is the case for example for an environment with 50-Ohm terminations at both ends or for signal paths with only small reflections. In such cases, the responses sr11, sr21, and sr22 can be neglected and deleted from the model. The measurement effort and the model complexity are strongly reduced.

Another example for the device to be modeled is a line driver controlled by a digital input signal. In this case, there is no response at the control input to anything happening at the output. Therefore s12 and s11 are not necessary.

Similar to S-parameters in the frequency domain, step responses can be used to characterize n-port networks with n>2. For example, coupled transmission lines for differential signaling would be an application for it.

In summary, the present invention introduces a new method of modeling linear and time invariant devices like signal paths or n-port networks. The principle has been derived from basic transmission line and systems theory and is based on step response measurement with a TDR oscilloscope. It has been validated by the means of a SPICE simulation showing the correlation between an arbitrarily chosen signal path model and the corresponding step response model.

What is claimed is:

1. A method comprising:
   (a) receiving a measured electrical signal response in at least one of time domain or frequency domain, wherein the measured electrical signal response represents an electrical behavior of an electronic device;
   (b) sampling the received measured electrical signal response at a plurality of sampling points and approximating each section of the received measured electrical signal response between two adjacent sampling points by a respective linear curve section;
   (c) for each section of the received measured electrical signal response between two adjacent sampling points:
      (i) selecting a pulse unit for generating a pulse having a transition between the two adjacent sampling points associated with the section; and
      (ii) selecting a current source or a voltage source providing, in response to the pulse from the selected pulse unit, an output signal corresponding to a slope of the section;
   (d) selecting an integrating unit for superimposing the output signals from each of the selected current or voltage sources for generating an approximated signal response; and
   (e) creating a model of the electronic device based on the selected pulse units, the selected current or voltage sources and the selected integrating unit.

2. The method of claim 1, wherein the measured electrical signal response comprises a signal selected from the group consisting of:
   a measured signal response to a predetermined electrical signal provided as a stimulus signal to the electronic device, and
   a response to a step signal so that the measured signal response comprises a step response.

3. The method of claim 1, wherein the measured electrical signal response is sampled in the time domain.

4. The method of claim 1, further comprising:
   calculating a ideal step response from a measured real step signal having a finite slew rate and from the measured electrical signal response to the measured real step signal.

5. The method of claim 4, wherein the ideal step response is calculated by a technique selected from the group consisting of a Fourier Transformation and a Fast Fourier Transformation.

6. The method of claim 1, wherein the model of the electronic device is generated by a system selected from the group consisting of a simulation system and a SPICE simulation system.

7. The method of claim 1, wherein the electronic device is selected from the group consisting of: a linear device, a time-invariant device, an electrical device, a signal path, a high-speed signal path, a line drive output, a line drive output of an automated test equipment, and an n-port network.

8. The method of claim 1, wherein the measured electrical signal response of the electronic device is a measurement selected from the group consisting of a time domain reflection measurement and a time domain transmission measurement.

9. The method of claim 1, further comprising:
   measuring the signal response of the electronic device in at least one of the time domain and the frequency domain.

10. A computer readable storage media containing executable computer program instructions which when executed cause a processing system to perform a method comprising:
    (a) receiving a measured electrical signal response in at least one of time domain or frequency domain, wherein the measured electrical signal response represents an electrical behavior of an electronic device;
    (b) sampling the received measured electrical signal response at a plurality of sampling points and approximating each section of the received measured electrical signal response between two adjacent sampling points by a respective linear curve section;
    (c) for each section the received measured electrical signal response between two adjacent sampling points:
       (i) selecting a pulse unit for generating a pulse having a transition between the two adjacent sampling points associated with the section; and
       (ii) selecting a current source or a voltage source providing, in response to the pulse from the selected pulse unit, an output signal corresponding to a slope of the section;
    (d) selecting an integrating unit for superimposing the output signals from each of the selected current or voltage sources for generating an approximated signal response; and
    (e) creating a model of the electronic device based on the selected pulse units, the selected current or voltage sources and the selected integrating unit.

11. A system comprising:
    (I) a receiver for receiving a measured electrical signal response in at least one of time domain or frequency domain, wherein the measured electrical signal response represents an electrical behavior of an electronic device;
    (II) a modeling unit for:
    (a) sampling the received measured electrical signal response at a plurality of sampling points and approximating each section of the received signal response between two adjacent sampling points by a respective linear curve section;
    (b) for each section of the received measured electrical signal response between two adjacent sampling points:
       (i) selecting a pulse unit for generating a pulse having a transition between the two adjacent sampling points associated with the section; and
       (ii) selecting a current source or a voltage source providing, in response to the pulse from the selected pulse unit, an output signal corresponding to a slope of the section;
    (c) selecting an integrating unit for superimposing the output signals from each of the selected current or voltage sources for generating an approximated signal response; and
    (d) creating a model of the electronic device based on the selected pulse units, the selected current or voltage sources and the selected integrating unit; and
    (III) a measuring unit for measuring the electrical behavior of the electronic device in at least one of the time domain or the frequency domain.

* * * * *